United States Patent

Lin

(10) Patent No.: US 8,796,849 B2
(45) Date of Patent: Aug. 5, 2014

(54) METAL BUMP JOINT STRUCTURE

(71) Applicant: Taiwan Semiconductor Manufacturing Company, Ltd., Hsin-Chu (TW)

(72) Inventor: Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/656,968

(22) Filed: Oct. 22, 2012

(65) Prior Publication Data

US 2014/0110839 A1    Apr. 24, 2014

(51) Int. Cl.
*H01L 23/48* (2006.01)
*H01L 23/52* (2006.01)

(52) U.S. Cl.
USPC .................. 257/738; 257/777; 257/778

(58) Field of Classification Search
USPC .............. 257/738, 777, 778, 780, E23.021, 257/E23.023
See application file for complete search history.

(56) References Cited

U.S. PATENT DOCUMENTS

2007/0152331 A1* 7/2007 Kang et al. .............. 257/737
2009/0146303 A1   6/2009 Kwon

FOREIGN PATENT DOCUMENTS

JP    10242383    9/1998

\* cited by examiner

*Primary Examiner* — Hung Vu
(74) *Attorney, Agent, or Firm* — Slater and Matsil, L.L.P.

(57) ABSTRACT

A structure comprises a first semiconductor chip with a first metal bump and a second semiconductor chip with a second metal bump. The structure further comprises a solder joint structure electrically connecting the first semiconductor chip and the second semiconductor chip, wherein the solder joint structure comprises an intermetallic compound region between the first metal bump and the second metal bump, wherein the intermetallic compound region is with a first height dimension and a surrounding portion formed along exterior walls of the first metal bump and the second metal bump, wherein the surrounding portion is with a second height dimension, and wherein the second height dimension is greater than the first height dimension.

20 Claims, 2 Drawing Sheets

METAL BUMP JOINT STRUCTURE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies further advance, chip-scale or chip-size packaging based semiconductor devices have emerged as an effective alternative to further reduce the physical size of a semiconductor chip. In a chip-scale packaging based semiconductor device, the packaging is generated on the die with contacts provided by a variety of bumps including copper bumps, solder balls and/or the like. Much higher density can be achieved by employing chip-scale packaging based semiconductor devices. Furthermore, chip-scale packaging based semiconductor devices can achieve smaller form factors, cost-effectiveness, increased performance, lower power consumption and lower heat generation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a metal bump joint structure at an interface between two semiconductor dies. The disclosure may also be applied, however, to a variety of joint structures of semiconductor devices. Hereinafter, various embodiments will be explained in detail with reference to the accompanying drawings.

Figure 1:
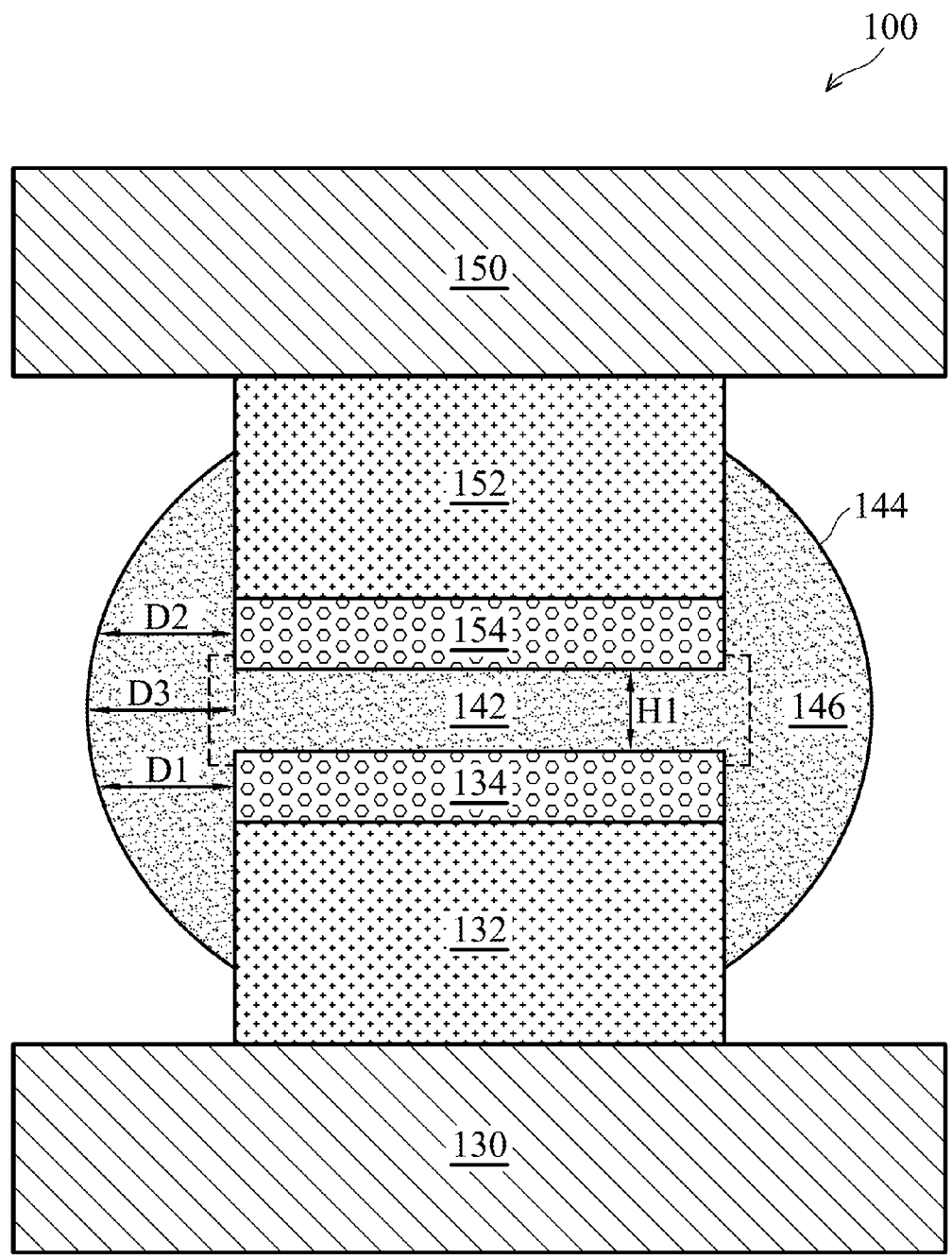
FIG. 1 illustrates a cross sectional view of a semiconductor device in accordance with various embodiments of the present disclosure.

FIG. 1 illustrates a cross sectional view of a semiconductor device in accordance with various embodiments of the present disclosure. The semiconductor device 100 includes a first semiconductor component 130 and a second semiconductor component 150. As shown in FIG. 1, the second semiconductor component 150 is stacked on top of the first semiconductor component 130 through a metal bump joint structure. The metal bump joint structure includes a first metal bump 132 formed over the first semiconductor component 130, a second metal bump 152 formed over the second semiconductor component 150 and a solder joint structure 144 at the interface between two semiconductor components 130 and 150. It should be noted while FIG. 1 illustrates one metal bump (e.g., metal bump 132) at each semiconductor component (e.g., first semiconductor component 130), both semiconductor components 130 and 150 can accommodate any number of metal bumps.

In some embodiments, both semiconductor components 130 and 150 are a semiconductor chip. In alternative embodiments, the semiconductor components 130 and 150 may be a package substrate, an interposer and/or the like. For simplicity, throughout the description, the first semiconductor component 130 and the second semiconductor component 150 are alternatively referred to as a first semiconductor chip 130 and a second semiconductor chip 150 respectively. The detailed structures of the first semiconductor chip 130 and the second semiconductor chip 150 will be described below with respect to FIG. 2.

The metal bumps 132 and 152 may be formed of copper. FIG. 1 shows both first metal bump 132 and the second metal bump 152 are of a rectangular shape. It should be noted that the shapes of the metal bumps 132 and 152 shown in FIG. 1 are merely an example. A person skilled in the art will recognize that the disclosure is applicable to a variety of semiconductor bumps such as ladder shaped bumps, which are commonly known as ladder connectors.

As shown in FIG. 1, barrier layers 134 and 154 are formed over the metal bumps 132 and 152 respectively. The barrier layers 134 and 154 may be formed of nickel (Ni), gold (Au), silver (Ag), palladium (Pd), Platinum (Pt), nickel-palladium-gold, nickel-gold, any combinations thereof and/or the like. The barrier layer 134 and 154 may be formed using suitable fabrication techniques such as plating and/or the like.

Prior to a reflow process through which the first semiconductor chip 130 and the second semiconductor chip 150 are bonded together, a solder ball (not shown) may be formed on either the first semiconductor chip 130 or the second semiconductor chip 150. Alternatively, the solder ball may be formed on one chip and a thin solder layer (not shown) may be formed on the other chip.

The solder ball may be made of any of suitable materials. In accordance with some embodiments, the solder ball may comprise SAC405. SAC405 comprises 95.5% Sn, 4.0% Ag and 0.5% Cu.

The first semiconductor chip 130 and the second semiconductor chip 150 may be bonded together through any suitable flip-chip bonding techniques. Solder ball thus joins the first semiconductor chip 130 and the second semiconductor chip 150 together. A reflow process is performed to melt solder ball to form the solder joint structure 144 shown in FIG. 1. In some embodiments, the reflow process may be performed at a temperature in a range from about 220 degrees C. to about 280 degrees C.

After the reflow process, due to a metallurgical reaction between solder (e.g., solder ball) and nickel (e.g., barrier layers 134 and 154 formed of nickel), an intermetallic compound (IMC) layer 142 is formed at the interface between the first metal bump 132 and the second metal bump 152. In some embodiments, the IMC layer 142 may contain $Ni_3Sn_4$. As shown in FIG. 1, the solder joint structure 144 may include two portions, namely the IMC portion 142 and a surrounding portion 146. As indicated by a dashed rectangle shown in FIG.

1, the IMC portion 142 is mainly located between the first barrier layer 134 and the second barrier layer 154. The surrounding portion 146 surrounds the exterior walls of the first metal bump 132 and the second metal bump 152.

FIG. 1 illustrates a cross sectional view of the surrounding portion 146. In a top view (not shown) of the semiconductor device 100, the surrounding portion 146 likes a belt wrapping around the interface between the first metal bump 132 and the second metal bump 152. The surrounding portion 146 may be of a uniform thickness at each cross section. However, due to process and operation variations, the thicknesses at various cross sections of the surrounding portion 146 may be not uniform. Assume that the cross sectional view of FIG. 1 is taken at the thinnest portion of the surrounding portion 146.

As shown in FIG. 1, the height of the IMC layer 142 is defined as H1. The horizontal distance between the first barrier layer 134 and the exterior surface of the solder joint structure 144 is defined as D1. Likewise, the horizontal distance between the second barrier layer 154 and the exterior surface of the solder joint structure 144 is defined as D2.

From the cross sectional view shown in FIG. 1, the surrounding portion 146 is of a half ellipse shape. The height of the half ellipse shape is defined as D3. Throughout the description, the height of the half ellipse shape is alternatively referred to as the height of the surrounding portion 146.

In order to have a reliable solder joint, the dimensions of the solder joint structure 144 may be subject to the following restrictions. A first ratio of D1 to H1 is greater than 1. Likewise, a second ratio of D2 to H1 is greater than 1 and a third ratio of D3 to H1 is greater than 1.

In some embodiments, H1 is a range from about 3 um to about 5 um. D1, D2 and D3 are in a range from about 4 um to about 6 um.

One advantageous feature of having the restrictions shown above is that the dimension restrictions help to prevent cracks from propagating along the interface between the first metal bump 132 and the second metal bump 152. Furthermore, it was observed in the reliability tests (e.g., thermal cycles performed on the stacked semiconductor chips) that with the solder joint structure 144 shown in FIG. 1, the reliability of the resulting stacked semiconductor chips is significantly improved.

Figure 2:
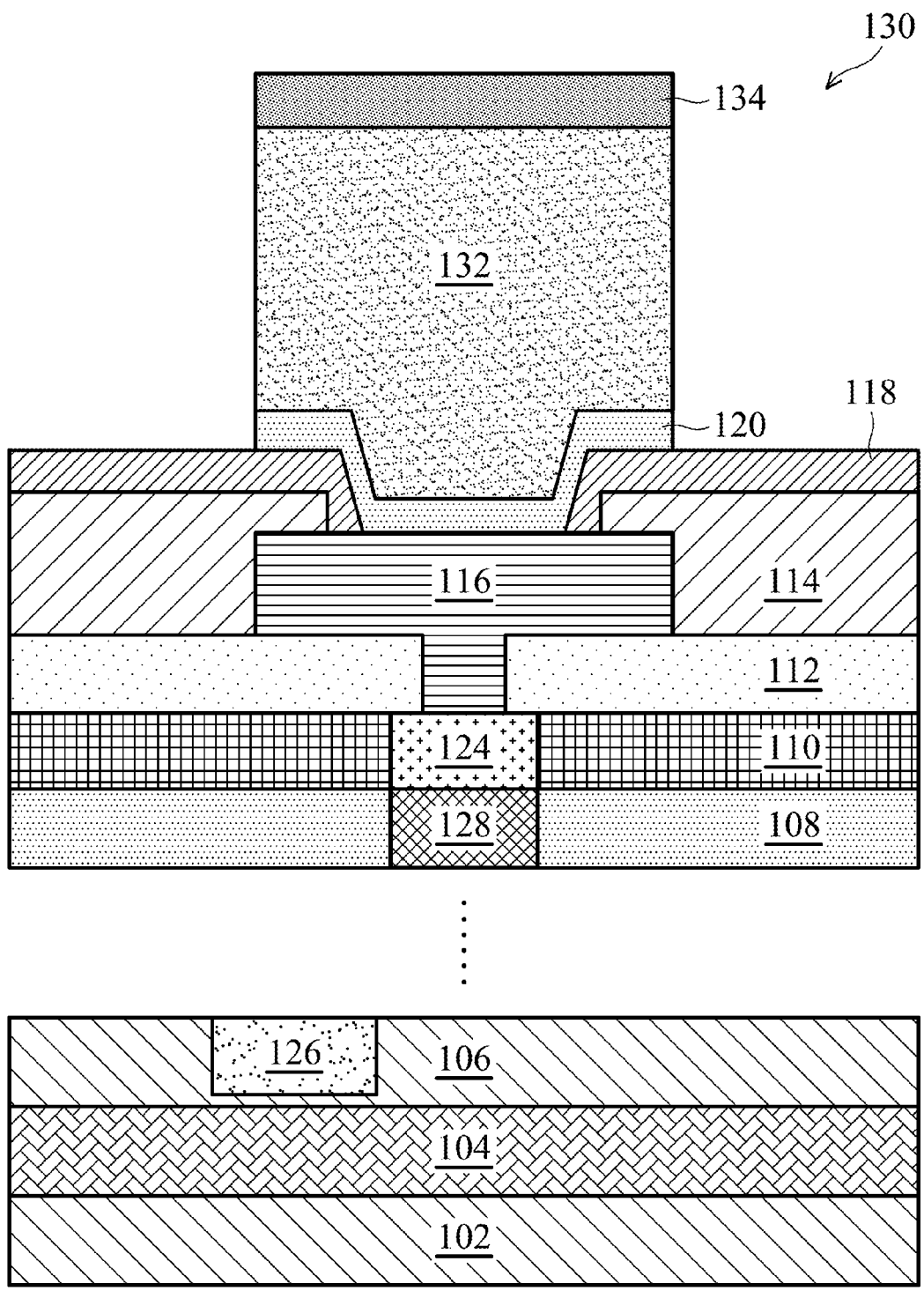
FIG. 2 illustrates in detail a cross sectional view of the semiconductor chips shown in FIG. 1 in accordance with various embodiments of the present disclosure.

FIG. 2 illustrates in detail a cross sectional view of the semiconductor chips shown in FIG. 1 in accordance with various embodiments of the present disclosure. As shown in FIG. 1, the semiconductor device 100 includes the first semiconductor chip 130 and the second semiconductor chip 150, wherein the first semiconductor chip 130 is coupled to the second semiconductor chip 150 through a solder joint. The first semiconductor chip 130 and the second semiconductor chip 150 may be of a same structure. For simplicity, only the detailed structure of the first semiconductor chip 130 is illustrated in FIG. 2.

As shown in FIG. 2, the first semiconductor chip 130 may comprise a substrate 102 and a plurality of interconnect components formed over the substrate 102. The substrate 102 may be formed of silicon, although it may also be formed of other group III, group IV, and/or group V elements, such as silicon, germanium, gallium, arsenic, and combinations thereof and/or the like.

The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like. The substrate 102 may further comprise a variety of electrical circuits (not shown). The electrical circuits formed on the substrate 102 may be any type of circuitry suitable for a particular application.

In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An interlayer dielectric layer 104 is formed on top of the substrate 102. The interlayer dielectric layer 104 may be formed, for example, of a low-K dielectric material, such as silicon oxide. The interlayer dielectric layer 104 may be formed by any suitable method known in the art, such as spinning, chemical vapor deposition (CVD) and plasma enhanced chemical vapor deposition (PECVD) and/or the like. It should also be noted that one skilled in the art will recognize that the interlayer dielectric layer 104 may further comprise a plurality of dielectric layers.

A bottom metallization layer 106 and a top metallization layer 108 are formed over the interlayer dielectric layer 104. As shown in FIG. 2, the bottom metallization layer 106 comprises a first metal line 126. Likewise, the top metallization layer 108 comprises a second metal line 128. Metal lines 126 and 128 are formed of metal materials such as copper or copper alloys and the like. The metallization layers 106 and 108 may be formed through any suitable techniques (e.g., deposition, damascene and the like). Generally, the one or more inter-metal dielectric layers and the associated metallization layers are used to interconnect the electrical circuits in the substrate 102 to each other to form functional circuitry and to further provide an external electrical connection.

It should be noted while FIG. 2 shows the bottom metallization layer 106 and the top metallization layer 108, one skilled in the art will recognize that one or more inter-metal dielectric layers (not shown) and the associated metallization layers (not shown) are formed between the bottom metallization layer 106 and the top metallization layer 108. In particular, the layers between the bottom metallization layer 106 and the top metallization layer 108 may be formed by alternating layers of dielectric (e.g., extreme low-k dielectric material) and conductive materials (e.g., copper).

A dielectric layer 110 is formed on top of the top metallization layer 108. As shown in FIG. 2, a top metal connector 124 is embedded in the dielectric layer 110. In particular, the top metal connector provides a conductive channel between the metal line 128 and the electrical connection structure of the semiconductor device. The top metal connector 124 may be made of metallic materials such as copper, copper alloys, aluminum, silver, gold and any combinations thereof. The top metal connector 124 may be formed by suitable techniques such as CVD. Alternatively, the top metal connector 124 may be formed by sputtering, electroplating and/or the like.

A first passivation layer 112 is formed on top of the dielectric layer 110. In accordance with an embodiment, the first passivation layer 112 is formed of non-organic materials such as un-doped silicate glass, silicon nitride, silicon oxide and the like. Alternatively, the first passivation layer 112 may be formed of low-k dielectric such as carbon doped oxide and the like. In addition, extreme low-k (ELK) dielectrics such as porous carbon doped silicon dioxide can be employed to form the first passivation layer 112. The first passivation layer 112 may be formed through any suitable techniques such as CVD and/or the like. As shown in FIG. 2, there may be an opening formed in the first passivation layer 112. The opening is used to accommodate the bond pad 116, which will be discussed in detail below.

A second passivation layer 114 is formed on top of the first passivation layer 112. The second passivation layer 114 may be similar to the first passivation layer 112, and hence is not discussed in further detail to avoid unnecessary repetition. As shown in FIG. 2, a bond pad 116 is formed in the openings of the first passivation and second passivation layers. In accordance with some embodiments, the bond pad 116 may be formed of aluminum. For simplicity, throughout the description, the bond pad 116 may be alternatively referred to as an aluminum pad 116.

The aluminum pad 116 may be enclosed by the first and second passivation layers 112 and 114. In particular, a bottom portion of the aluminum pad 116 is embedded in the first passivation layer 112 and a top portion of the aluminum pad 116 is embedded in the second passivation layer 114. The first and second passivation layers 112 and 114 overlap and seal the edges of the aluminum pad 116 so as to improve electrical stability by preventing the edges of the aluminum pad 116 from corrosion. In addition, the passivation layers 112 and 114 may help to reduce the leakage current of the semiconductor device.

A polymer layer 118 is formed on top of the second passivation layer 114. The polymer layer 118 is made of polymer materials such as epoxy, polyimide and the like. In particular, the polymer layer 118 may comprise photo-definable polyimide materials such as HD4104. For simplicity, throughout the description, the polymer layer 118 may be alternatively referred to as the PI layer 118. The PI layer 118 may be made by any suitable method known in the art such as spin coating and/or the like. A redistribution layer (not shown) may be formed in the semiconductor device 100 if the bond pads are relocated to new locations. The redistribution layer provides a conductive path between the metal lines (e.g., metal line 128) and the redistributed bond pads. The operation principles of redistribution layers are well known in the art, and hence are not discussed in detail herein.

The PI layer 118 is patterned to form a plurality of openings. Furthermore, various under bump metal (UBM) structures (not shown) are formed on top of the openings. The UBM structures are employed to connect the aluminum pads (e.g., aluminum pad 116) with various input and output terminals (e.g., metal bump 132). The UBM structures may be formed by any suitable techniques such as electroplating. Other processes of formation such as sputtering, evaporation, PECVD and/or the like may alternatively be used depending upon the desired materials.

In some embodiments, the metal bump 132 may be a copper bump. The copper bump may be of a height of approximately 16 um. A variety of semiconductor packaging technologies such as sputtering, electroplating and photolithography can be employed to form the metal bump 132. As known in the art, in order to insure the reliable adhesion and electrical continuity between the copper bump and the bond pad 116, additional layers including a barrier layer, an adhesion layer and a seed layer (not shown respectively) may be formed between the metal bump 132 and the bond pad 116.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a first semiconductor component having:
      a first metal bump comprising a first material and formed on a surface of the first semiconductor component; and
      a first barrier layer comprising a second material different from the first material and formed on the first metal bump;
   a second semiconductor component having:
      a second metal bump comprising a third material and formed on a surface of the second semiconductor component; and
      a second barrier layer comprising a fourth material different from the third material and formed on the second metal bump; and
   a solder joint structure electrically connecting the first metal bump and the second metal bump, wherein the solder joint structure comprises:
      an intermetallic compound region formed between the first barrier layer and the second barrier layer, the intermetallic compound region comprising a compound comprising at least one element of the second material and/or the fourth material and at least one element of a solder material, wherein the intermetallic compound region has a vertical dimension from the first barrier layer to the second barrier layer; and
      a surrounding portion comprising the solder material and formed along exterior walls of the first metal bump and the second metal bump, wherein the surrounding portion has a lateral dimension from a point aligned with at least one of respective walls of the first barrier layer and the second barrier layer to a nearest exterior surface of the surrounding portion, and wherein the lateral dimension is greater than the vertical dimension.

2. The structure of claim 1, wherein:
   the surrounding portion is of a half ellipse shape; and
   the surrounding portion comprises:
      a first lateral distance from the wall of the first barrier layer to a surface of the half ellipse shape; and
      a second lateral distance from the wall of the second barrier layer to the surface of the half ellipse shape, and wherein:
         the first lateral distance is greater than the vertical dimension; and
         the second lateral distance is greater than the vertical dimension.

3. The structure of claim 1, wherein:
the second material is nickel; and
the fourth material is nickel.

4. The structure of claim 1, wherein:
the compound comprises $Ni_3Sn_4$.

5. The structure of claim 1, wherein:
the first material is copper; and
the third material is copper.

6. The structure of claim 1, wherein:
the first semiconductor component is a semiconductor chip; and
the second semiconductor component is a package substrate.

7. The structure of claim 1, wherein:
the first semiconductor component is a package substrate; and
the second semiconductor component is a semiconductor chip.

8. The structure of claim 1, wherein:
the first semiconductor component is a first semiconductor chip; and
the second semiconductor component is a second semiconductor chip.

9. A device comprising:
a first semiconductor chip comprising:
a first semiconductor substrate;
a first interconnect structure formed on the first semiconductor substrate;
a first copper bump formed on the first interconnect structure; and
a first barrier layer on a first planar surface of the first copper bump and not on a second surface of the first copper bump;
a second semiconductor chip stacked on the first semiconductor chip, wherein the second semiconductor chip comprises:
a second semiconductor substrate;
a second interconnect structure formed on the second semiconductor substrate;
a second copper bump formed on over the second interconnect structure; and
a second barrier layer on a third planar surface of the second copper bump and not on a fourth surface of the second copper bump; and
a solder joint structure electrically connecting the first copper bump and the second copper bump, wherein the solder joint structure comprises:
an intermetallic compound region formed between the first barrier layer and the second barrier, wherein the intermetallic compound region has a vertical dimension from the first barrier layer to the second barrier layer; and
a surrounding portion formed along exterior walls of the first copper bump and the second copper bump, wherein the surrounding portion a lateral dimension from a point aligned with at least one of walls of the first barrier layer and the second barrier layer to a nearest exterior surface of the surrounding portion, and wherein the lateral dimension is greater than the vertical dimension.

10. The device of claim 9, wherein the first interconnect structure comprises:
a first metal layer formed on the first semiconductor substrate;
a first dielectric layer formed on the first metal layer;
a second metal layer formed on the first dielectric layer;
a first passivation layer formed on the second metal layer;
a second passivation layer formed on the first passivation layer;
a bond pad embedded in the first passivation layer and the second passivation layer;
a polymer layer formed on the second passivation layer; and
the first copper bump formed on the bond pad.

11. The device of claim 9, wherein:
the first barrier layer is formed of nickel; and
the second barrier layer is formed of nickel.

12. The device of claim 9, wherein:
the surrounding portion is of a half ellipse shape.

13. The device of claim 9, wherein:
the intermetallic compound region comprises $Ni_3Sn_4$.

14. The device of claim 9, wherein:
the vertical dimension is in a range from about 3 um to about 5 um.

15. The device of claim 9, wherein:
the lateral dimension is in a range from about 4 um to about 6 um.

16. A structure comprising:
a first package component having a first copper bump on a first surface of the first package component and a first barrier layer on the first copper bump disposed distally from the first surface, the first barrier layer comprising a first material different from copper;
a second package component having a second copper bump on a second surface of the second package component and a second barrier layer on the second copper bump disposed distally from the second surface, the second barrier layer comprising a second material different from copper;
a intermetallic compound region between the first barrier layer and the second barrier layer and comprising an intermetallic compound, the intermetallic compound region having a vertical dimension from the first barrier layer and the second barrier layer; and
a surrounding portion along respective walls of the first copper bump, the first barrier layer, the second copper bump, and the second barrier layer, the surround portion comprising a solder material, the intermetallic compound comprising at least one element of the solder material and at least one element of the first material and/or the second material, the surrounding portion having a lateral dimension from a point aligned with at least one of the respective walls of the first barrier layer and the second barrier layer to a nearest exterior surface of the surrounding portion, the lateral dimension being greater than the vertical dimension.

17. The structure of claim 16, wherein the surrounding portion is a half ellipse shape and has:
a first lateral distance from the wall of the first barrier layer to a nearest exterior surface of the half ellipse shape, the first lateral distance being greater than the vertical dimension; and
a second lateral distance from the wall of the second barrier layer to a nearest exterior surface of the half ellipse shape, the second lateral distance being greater than the vertical dimension.

18. The structure of claim 16, wherein the intermetallic compound is $Ni_3Sn_4$.

19. The structure of claim 16, wherein the first material and the second material each comprise nickel.

20. The structure of claim 16, wherein the first package component is a semiconductor chip, and the second package component is a package substrate.

* * * * *

UNITED STATES PATENT AND TRADEMARK OFFICE
CERTIFICATE OF CORRECTION

| | | |
|---|---|---|
| PATENT NO. | : 8,796,849 B2 | Page 1 of 1 |
| APPLICATION NO. | : 13/656968 | |
| DATED | : August 5, 2014 | |
| INVENTOR(S) | : Jing-Cheng Lin | |

It is certified that error appears in the above-identified patent and that said Letters Patent is hereby corrected as shown below:

In the Claims

In Col. 7, line 40, claim 9, delete "formed on over the" and insert --formed on the--

Signed and Sealed this
Twenty-first Day of October, 2014

Michelle K. Lee
*Deputy Director of the United States Patent and Trademark Office*